United States Patent
Cha

(10) Patent No.: US 6,759,294 B2
(45) Date of Patent: Jul. 6, 2004

(54) METHOD OF FORMING A CAPACITOR IN A SEMICONDUCTOR DEVICE

(75) Inventor: Jae Han Cha, Cheongjoo-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 0 days.

(21) Appl. No.: 10/610,633

(22) Filed: Jul. 2, 2003

(65) Prior Publication Data
US 2004/0087083 A1 May 6, 2004

(30) Foreign Application Priority Data
Nov. 6, 2002 (KR) .................. 10-2002-0068333

(51) Int. Cl.⁷ .................................. H01L 21/8242
(52) U.S. Cl. ............................ 438/253; 438/396
(58) Field of Search ........................ 438/239, 253, 438/329, 396, FOR 212, FOR 220, FOR 430

(56) References Cited

U.S. PATENT DOCUMENTS

| | | | |
|---|---|---|---|
| 5,677,222 A | | 10/1997 | Tseng |
| 5,851,876 A | | 12/1998 | Jenq |
| 5,854,105 A | * | 12/1998 | Tseng ................... 438/253 |
| 6,064,085 A | | 5/2000 | Wu |
| 6,090,664 A | | 7/2000 | Lou |
| 6,218,237 B1 | * | 4/2001 | Sandhu et al. ........... 438/253 |
| 6,376,326 B1 | | 4/2002 | Lou |
| 6,395,602 B2 | * | 5/2002 | Sandhu et al. ........... 438/253 |
| 6,602,754 B1 | * | 8/2003 | Kluth et al. ............. 438/303 |

* cited by examiner

Primary Examiner—George Fourson
Assistant Examiner—Fernando L. Toledo
(74) Attorney, Agent, or Firm—Jacobson Holman PLLC

(57) ABSTRACT

Disclosed is a method of forming a capacitor in a semiconductor device. The method comprises the steps of forming word lines on a semiconductor substrate in which semiconductor constitution elements are formed, sequentially forming a first interlayer insulating film, a first conductive layer and a second interlayer insulating film on the entire structure including the word lines, removing portions of the second interlayer insulating film, the first conductive layer and the first interlayer insulating film to form contact holes, forming a second conductive layer on the entire structure including the contact holes and then patterning the second conductive layer to connect the first and second conductive layers, removing the second interlayer insulating film without a mask process to form a bottom electrode consisting of the first and second conductive layers, etching the first conductive layer using the second conductive layer as an etch pattern without a mask process, and forming a dielectric film and a top electrode on the entire structure including the bottom electrode.

10 Claims, 4 Drawing Sheets

METHOD OF FORMING A CAPACITOR IN A SEMICONDUCTOR DEVICE

BACKGROUND OF THE INVENTION

1. Field of the Invention

The present invention relates to a method of forming a capacitor in a semiconductor device, and more particularly, to a method of forming a capacitor in a semiconductor device that is suitable for a SOC (Silicon On a Chip) device.

2. Background of the Related Art

In an exemplary conventional method of forming a memory capacitor in a DRAM device, a cylinder type capacitor is employed, as a shown in FIG. 1.

Referring to FIG. 1, the conventional method of forming the capacitor will be described roughly.

A word line 200 is formed on a semiconductor substrate 100. An interlayer insulating film 300 and a wet anti-etch film 400 are then formed on the entire structure including the word line 200. Next, a series of processes for forming portions of the wet anti-etch film 400 and the interlayer insulating film 300 are implemented to form a source contact 500. Thereafter, a bottom electrode 600 of a cylinder type connected to the source (not shown) through the source contact 500 is formed. A dielectric film 700 is then formed on the bottom electrode 600. A conductive layer 800 is deposited on the entire structure including the dielectric film 700 to form a plate electrode. Thereby, the capacitor of the cylinder type is completed.

In this capacitor of the cylinder type, it is a general trend that the height of the cylinder is increased in order to increase the area of the capacitor. In order to implement devices such as SOC, however, it is required that a smoothing process for mitigating the steps of the DRAM unit and the logic circuit unit be implemented. Due to this, there are disadvantages that there is a limit in increasing the height of the cylinder and it is difficult to implement a deep metal contact. Furthermore, at least four mask processes are required in order to implement the capacitor of the cylinder shape shown in FIG. 1. Therefore, there is a disadvantage that the process is complicated.

SUMMARY OF THE INVENTION

Accordingly, the present invention is contrived to substantially obviate one or more problems due to limitations and disadvantages of the related art, and an object of the present invention is to provide a method of a method of forming a capacitor in a semiconductor device capable of implementing the capacitor by means of more simple process without affecting implementation of a logic device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a capacitor in a semiconductor device according to the present invention is characterized in that it comprises the steps of forming word lines on a semiconductor substrate in which semiconductor constitution elements are formed, sequentially forming a first interlayer insulating film, a first conductive layer and a second interlayer insulating film on the entire structure including the word lines, removing portions of the second interlayer insulating film, the first conductive layer and the first interlayer insulating film to form contact holes, forming a second conductive layer on the entire structure including the contact holes and then patterning the second conductive layer to connect the first and second conductive layers, removing the second interlayer insulating film without a mask process to form a bottom electrode consisting of the first and second conductive layers, etching the first conductive layer using the second conductive layer as an etch pattern without a mask process, and forming a dielectric film and a top electrode on the entire structure including the bottom electrode.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

A method of forming a capacitor in the device according to a preferred embodiment of the present invention will be described by reference to FIG. 2A~FIG. 2F.

Figure 1:
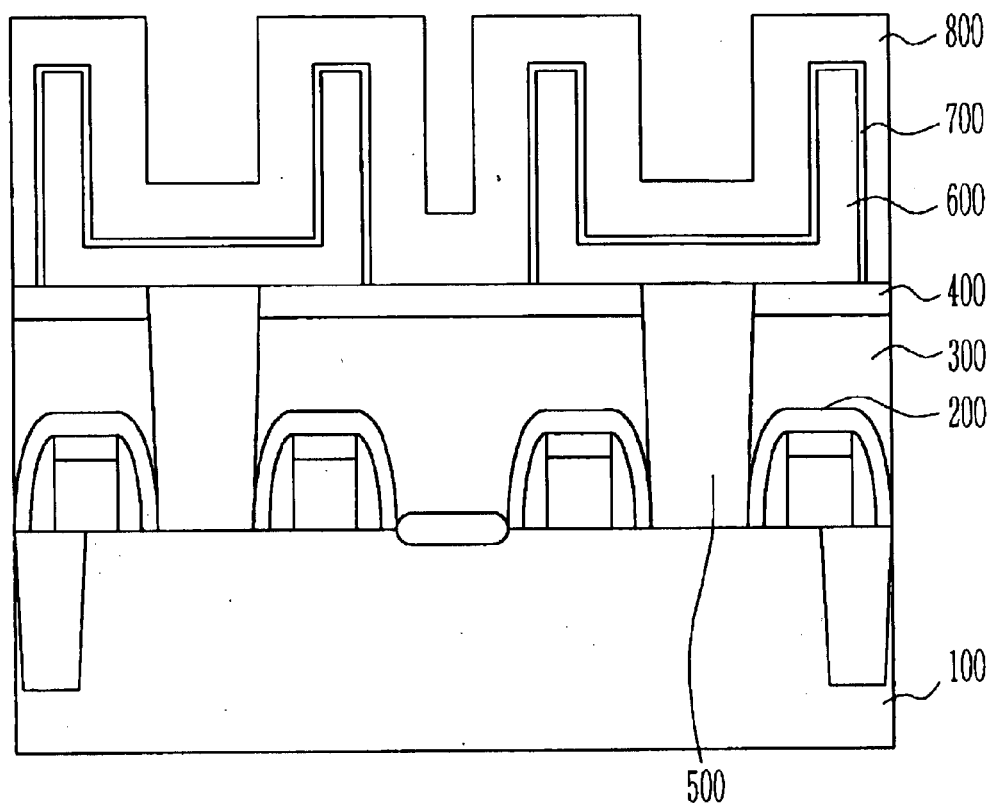
FIG. 1 is a cross-sectional view of a semiconductor device for explaining a conventional method of forming a capacitor.
Figure 2A:
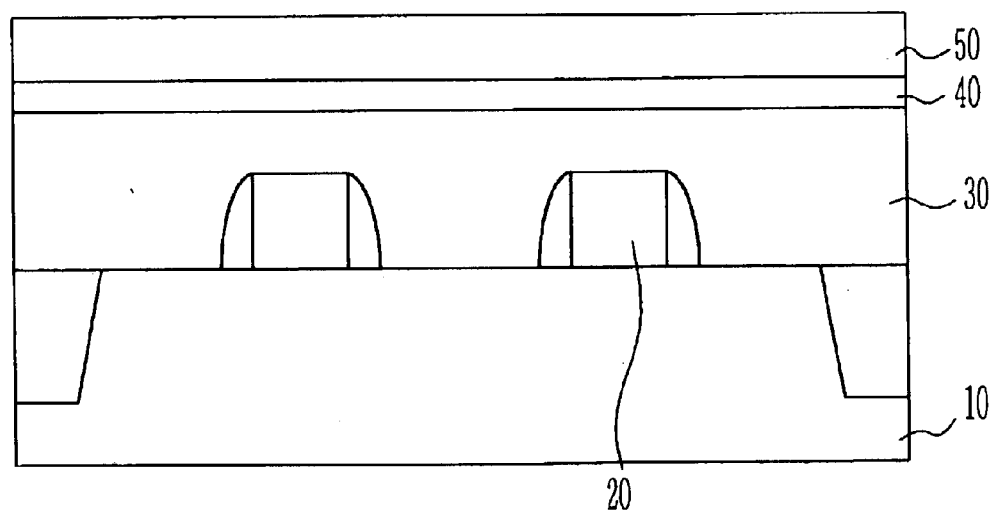
FIG. 2A~FIG. 2F are cross-sectional views of semiconductor devices for explaining a method of forming a capacitor in the device according to a preferred embodiment of the present invention.

Referring to FIG. 2A, word lines 20 are formed on a semiconductor substrate 10 in which semiconductor constitution elements are formed. Next, a first interlayer insulating film 30 is formed on the entire structure including the word lines 20 and is then performed a planarization process. Thereafter, a first conductive layer 40 is formed on the first interlayer insulating film 30. Then, a second interlayer insulating film 50 for maximizing the capacitor bottom electrode is formed on the first conductive layer 40. At this time, it is preferred that the first conductive layer 40 is sufficiently thick enough to act as an anti-etch film against an insulating film for forming the shape of the capacitor show in FIG. 2D during a wet etch process for the insulating film.

Figure 2B:
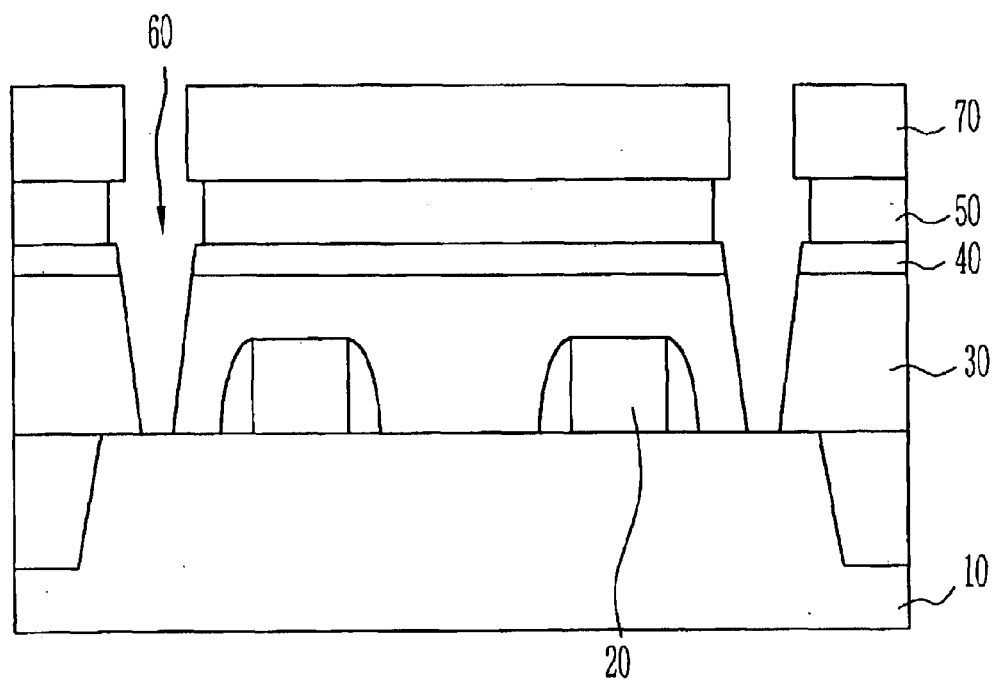

By reference to FIG. 2B, contact holes 60 are formed by means of a photo masking and etch process for a storage node contact in the DRAM capacitor. At this time, the contact holes 60 are formed by removing the second interlayer insulating film 50, the first conductive layer 40 and the first interlayer insulating film 30 using a photoresist film pattern 70 as a mask. This contact hole 40 is formed by means of a wet etch process capable of selectively removing the oxide film using diluted HF solution, BOE, etc. after the dry etch process. The purpose of this process is to facilitate burial of a lower conductive layer by making the contact hole of the storage node contact a little large and to allow better connection characteristic between the lower conductive layers. Therefore, the capacitor insulating film can select a material having a wet etch rate faster than the first interlayer insulating film 30.

Figure 2C:
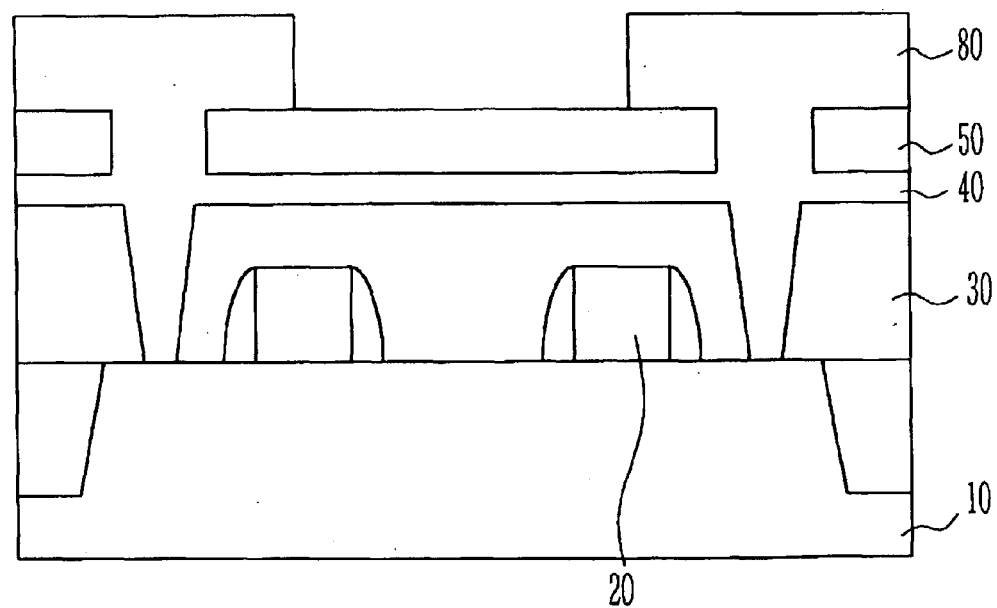

Referring to FIG. 2C, the photoresist film pattern 70 is removed. A second conductive layer 80 is then formed on the entire structure. At this time, it is preferred that the thickness of the second conductive layer 80 is thicker than that of the first conductive layer 40. Thereafter, the second conductive layer 80 is patterned by means of a photo masking process and an etch process. Through these processes, the first and second conductive layers 40 and 80 are connected each other. At this time, a portion or all of the second interlayer insulating film 50 may be experienced by dry etch after the second conductive layer 80 is patterned.

Figure 2D:
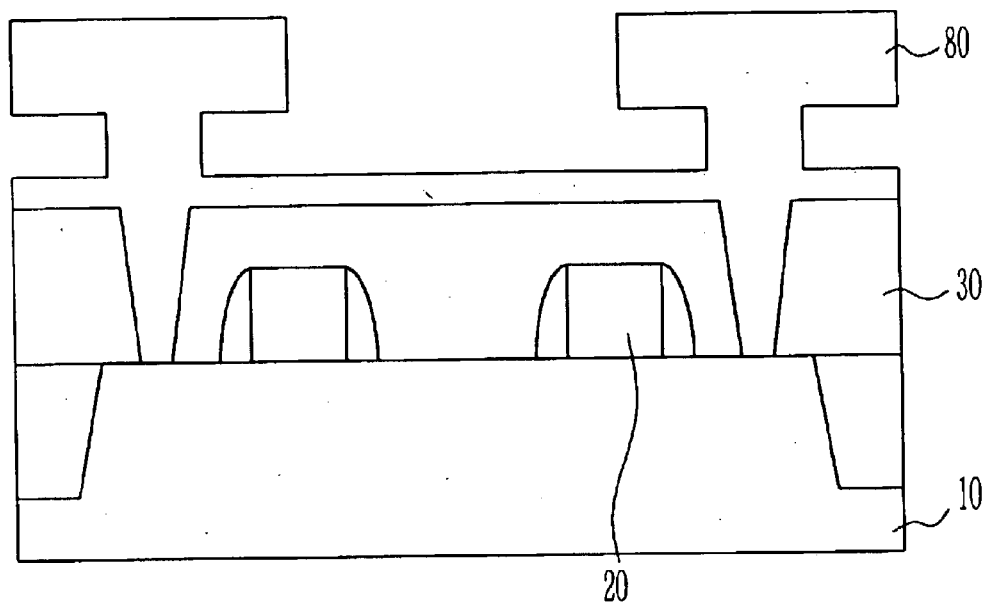

By reference to FIG. 2D, the photoresist film pattern (not shown) used in the process of FIG. 2C is removed. All of the second interlayer insulating film 50 is then removed by a wet etch process.

Figure 2E:
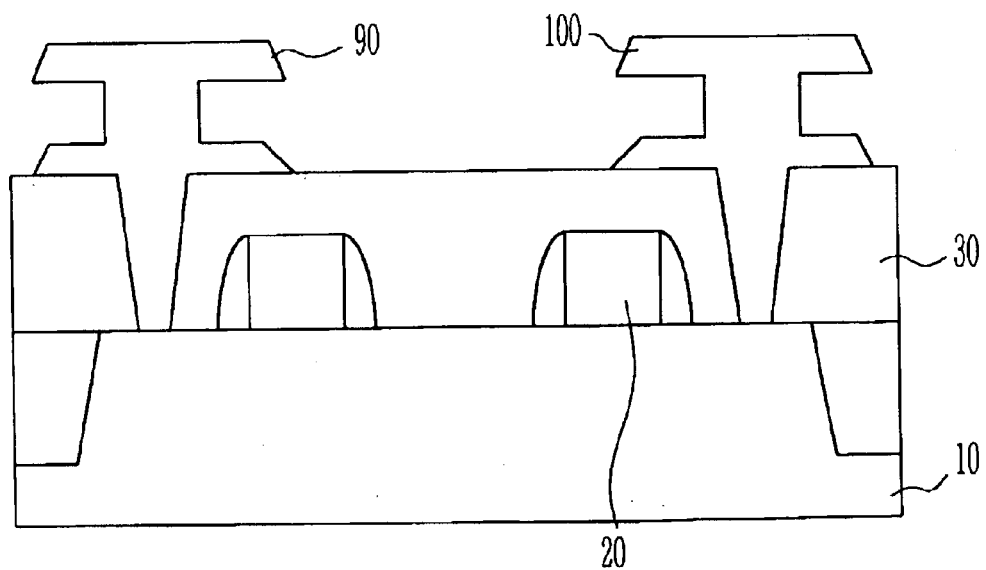

Referring to FIG. 2E, the first conductive layer 40 exposed for insulation between the capacitors is removed by a blanket etch process. Thereby, first and second bottom electrodes 90 and 100 are completed.

Figure 2F:
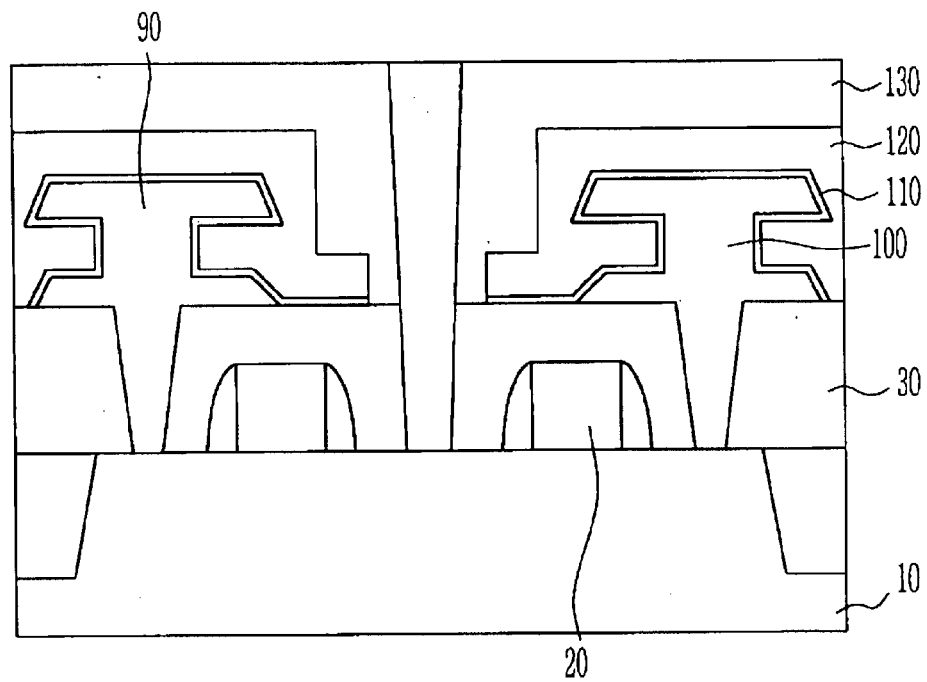

By reference to FIG. 2F, a capacitor dielectric film 110 is formed on the entire structure. A top electrode 120 is then formed on the capacitor dielectric film 110. At this time, the dielectric film 110 may be formed using one of an oxide film, a nitride film, $Al_2O_3$, $HFO_2$ and a ferro-dielectric film. Next, a third interlayer insulating film 130 for insulation between bit lines is formed on the entire structure including the top electrode 120. A smoothing process is then performed to form a bit line contact. A capacitor having two plates is thus completed.

In the above process, it is preferred that each of the first and second conductive layer 40 and 80, and the top electrode 120 is formed using one of polysilicon, Ti, TiN, W, Pt, Al and Cu. It is also preferred that a surface treatment process is implemented when the first and second conductive layers 40 and 80 are formed using polysilicon. At this time, the surface treatment process is performed using HSG and MPS. Furthermore, a cleaning process may be implemented before the first and second conductive layers 40 and 80 are formed.

Also, in removing a portion of the second interlayer insulating film through a post-treatment process after the contact hole is formed, a cleaning process may be performed after an etch process for forming the contact hole is performed, or a cleaning process may be performed before the second conductive layer is deposited.

Furthermore, a portion of the contact hole may be increased using all kinds of available insulating films in which the etch rate of the second interlayer insulating film is relatively faster than that of the first interlayer insulating film.

In manufacturing a reticle for the photo masking process for forming the above top electrode, it is preferred that the reticle is manufactured so that a portion of the top electrode in the region where the bit line contact will be is formed is removed in order to facilitate a process of forming a metal contact for connecting the bit lines in the memory device.

Figure 3:
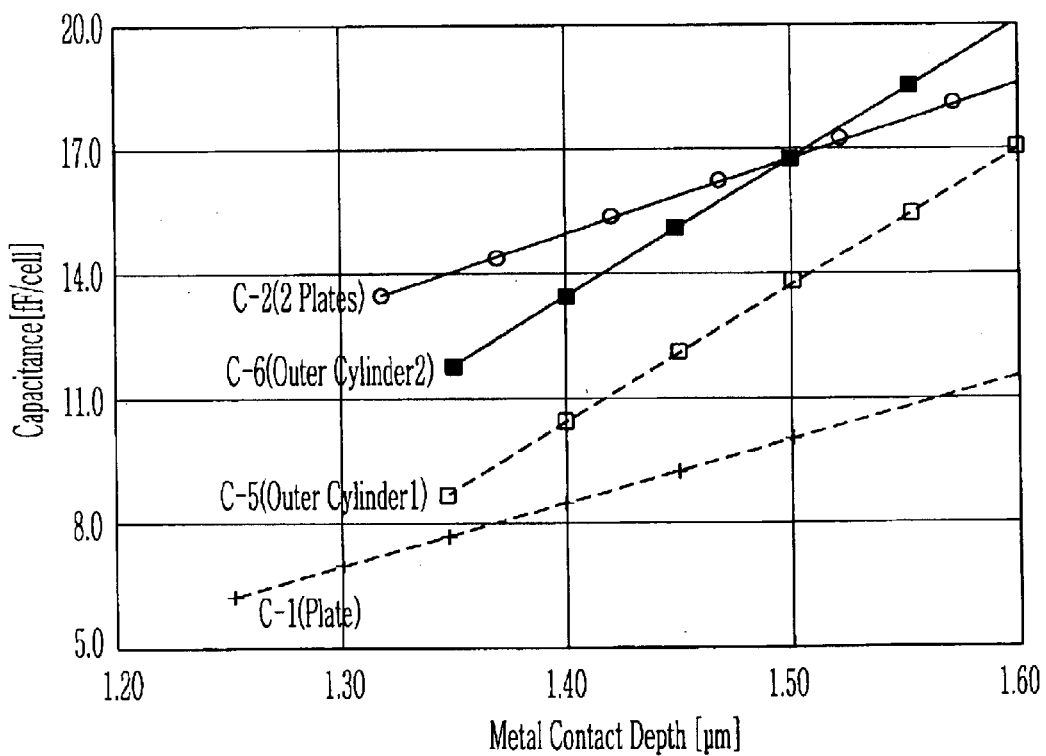
FIG. 3 is a graph for explaining comparison of capacitance values between the conventional capacitor and the capacitor of the present invention.

FIG. 3 is a graph for explaining comparison of capacitance values between the conventional capacitor and the capacitor of the present invention.

FIG. 3 illustrates a graph in which a capacitance characteristic depending on the height of the capacitor of the cylinder shape is expressed into a function of the depth of a subsequent metal contact. The capacitance value is a result calculated considering that the capacitor has a layout of the capacitor bottom electrode having the same area. From FIG. 3, it could be seen that capacitance of the capacitor of the present invention is much high in the height of the capacitor that is a little low in the depth of the metal contact that is a little shallow.

In FIG. 3, a line (C-1) indicates the capacitance value when the capacitor has one plate, a line (C-5) indicates the capacitance value when the capacitor has one cylinder, a line (C-6) indicates the capacitance value when the capacitor has tow cylinders, and a line (C-2) indicates the capacitance value when the capacitor has two plates. The line (C-2) corresponds to the present invention.

As described above, according to the present invention, the photo mask process is reduced compared to the conventional process of forming the capacitor of the cylinder shape. Therefore, the present invention has an advantageous effect that it can reduce a process time and a unit cost. Furthermore, an unnecessary height of the capacitor is not needed in order to secure a sufficient capacitance value. Accordingly, it is possible to allow a DRAM integration process for effectively implementing the SOC device. The density of the DRAM mounted on the SOC product manufactured thus is low compared to the conventional DRAM. However, the DRAM mounted on the SOC product could be integrated twice or three times on the same implementation techniques compared to a device (MPDL: merged planar DRAM on logic) using a MOS capacitor being developed current as the memory device. Therefore, the present process is an indispensable capacitor formation process for a SOC product (MXDL: merged mixed DRAM on logic) on which the memory device that is intermediate between MPDL and MDL (merged DRAM on logic) is mounted.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a capacitor in a semiconductor device, comprising the steps of:

forming word lines on a semiconductor substrate in which semiconductor constitution elements are formed;

sequentially forming a first interlayer insulating film, a first conductive layer and a second interlayer insulating film on the entire structure including the word lines;

removing portions of the second interlayer insulating film, the first conductive layer and the first interlayer insulating film to form contact holes;

forming a second conductive layer on the entire structure including the contact holes and then patterning the second conductive layer to connect the first and second conductive layers;

removing the second interlayer insulating film without a mask process to form a bottom electrode consisting of the first and second conductive layers;

etching the first conductive layer using the second conductive layer as an etch pattern without a mask process; and forming a dielectric film and a top electrode on the entire structure including the bottom electrode.

2. The method as claimed in claim 1, wherein the dielectric film is one of an oxide film, the nitride film, $Al_2O_3$, $HFO_2$ and a ferro-dielectric film, or a stack layer of a dielectric film.

3. The method as claimed in claim 1, wherein each of the first and second conductive layer, and the top electrode is one of polysilicon, Ti, TiN, W, Pt, Al and Cu, or a stack layer of a conductive layer.

4. The method as claimed in claim 1, further comprising the step of implementing a surface treatment process when the first and second conductive layer are formed using polysilicon.

5. The method as claimed in claim 4, wherein the surface treatment process is implemented using HSG and MPS.

6. The method as claimed in claim 1, further comprising the step of implementing a cleaning process for the first and second conductive layers respectively, before the process of depositing the first and second conductive layers.

7. The method as claimed in claim 1, wherein the second interlayer insulating film is removed by a wet etch process.

8. The method as claimed in claim 1, further comprising the step of implementing a cleaning process after the etch process for formation of the contact hole, or the step of implementing a cleaning process before deposition of the second conductive layer.

9. The method as claimed in claim 1, wherein all kinds of available insulating films in which the etch rate of the second interlayer insulating film is relatively faster than that of the first interlayer insulating film are employed.

10. The method as claimed in claim 1, further comprising the step of removing the top electrode in the region where a bit line contact will be formed in order to facilitate a process of forming a metal contact for connecting of the bit lines in the memory device.

* * * * *